US009128888B2

(12) United States Patent
Huebner et al.

(10) Patent No.: US 9,128,888 B2
(45) Date of Patent: Sep. 8, 2015

(54) METHOD AND APPARATUS FOR TURBO DECODER MEMORY COLLISION RESOLUTION

(75) Inventors: Axel Huebner, Munich (DE); Jens Berkmann, Munich (DE); Michael Janning, Mettmann (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 564 days.

(21) Appl. No.: 13/599,926

(22) Filed: Aug. 30, 2012

(65) Prior Publication Data
US 2014/0068117 A1    Mar. 6, 2014

(51) Int. Cl.
G06F 13/12 (2006.01)
H03M 13/00 (2006.01)
G06F 13/16 (2006.01)
G06F 13/376 (2006.01)
G06F 13/38 (2006.01)
H03M 13/27 (2006.01)
H03M 13/29 (2006.01)

(52) U.S. Cl.
CPC ............. *G06F 13/16* (2013.01); *G06F 13/376* (2013.01); *G06F 13/38* (2013.01); *H03M 13/2775* (2013.01); *H03M 13/2957* (2013.01)

(58) Field of Classification Search
CPC ...................... H03M 13/2957; H03M 13/6356
USPC .......................................................... 710/52
See application file for complete search history.

(56) References Cited

U.S. PATENT DOCUMENTS

| 5,406,570 A | 4/1995 | Berrou et al. |
| 2008/0104478 A1 | 5/2008 | Oz et al. |
| 2008/0133998 A1 | 6/2008 | Nimbalker et al. |

OTHER PUBLICATIONS

C. Berrou, A. Glavieux and P. Thitimajshima, Near Shannon limit error-correcting coding and decoding: Turbo-codes, in Proc. of the IEEE International Conference on Communication, May 1993, pp. 1064-1070, Geneva, Switzerland.
L Bahl, J. Cocke, F. Jelinek, and J. Raviv, Optimal decoding of linear codes for minimizing symbol error rate, IEEE Transactions on Information Theory, Mar. 1974, pp. 284-287, vol. IT-20, No. 2.
A. Nimbalker, T.E. Fuja, D.J.Costello, Jr., T.K. Blankenship, and B. Classon, Contention-free interleavers, in Proc. of the IEEE International Symposium on Information Theory, Jun. 2004, p. 54, Chicago, IL.

(Continued)

*Primary Examiner* — Titus Wong

(57) ABSTRACT

A device such as a turbo decoding device is proposed in which an intermediate buffering device including an address buffering device and an element buffering device is communicatively coupled to a plurality of processing devices and a memory device. During a cycle of a parallel decoding process, the intermediate buffering device receives, from two different processing devices, first and second address information respectively corresponding to first and second elements of a code sequence stored in the memory device. During the cycle, the intermediate buffering device transmits a request for the first element to the memory device based on the first address information and stores the second address information in the address buffering device. Subsequently, during the cycle, the intermediate buffering device receives first element information corresponding to the first element from the memory device and stores the received first element information in the element buffering device.

20 Claims, 13 Drawing Sheets

(56) References Cited

OTHER PUBLICATIONS

O.Y. Takeshita, On maximum contention-free interleavers and permutation polynomials over integer rings, IEEE Transactions on Information Theory, Mar. 2006, pp. 1249-1253, vol. IT-52.

3GPP TS 36.212 V10.3.0, 3rd Generation Partnership Project; Technical Specification Group Radio Access Network; Evolved Universal Terrestrial Radio Access (E-UTRA); Multiplexing and channel coding (Release 10), Sep. 2011.

3GPP TS 25.212 V8.5.0, 3rd Generation Partnership Project; Technical Specification Group Radio Access Network; Multiplexing and channel coding (FDD) (Release 8), Mar. 2009.

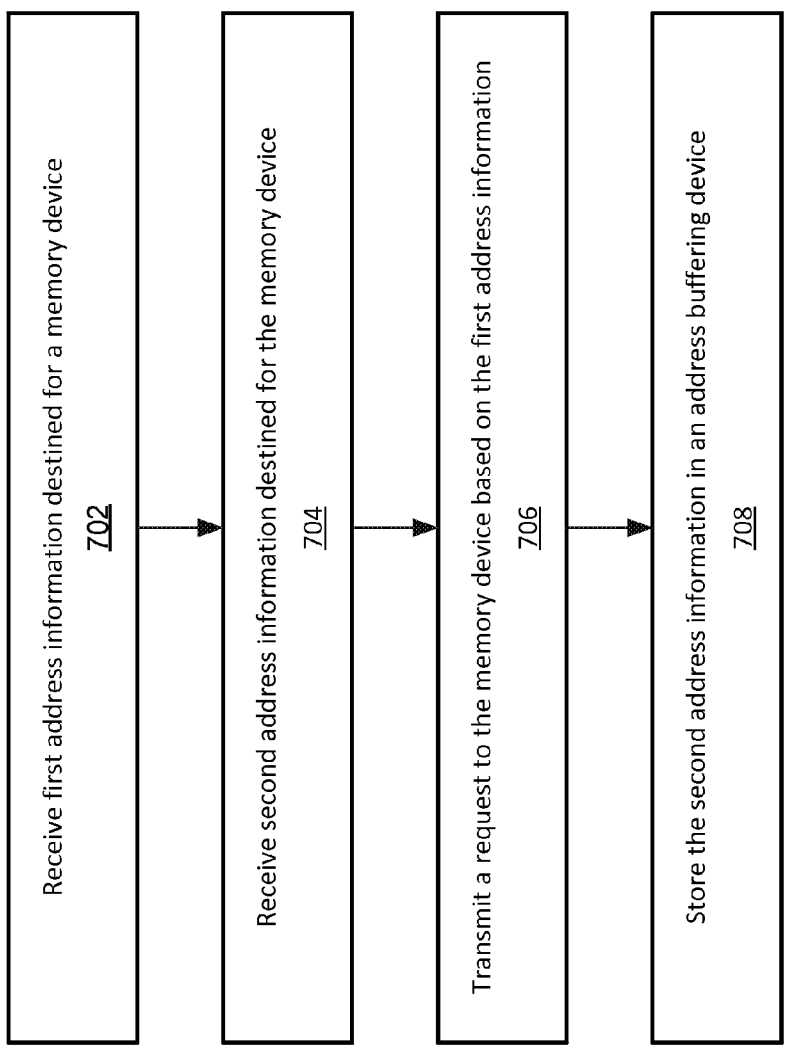

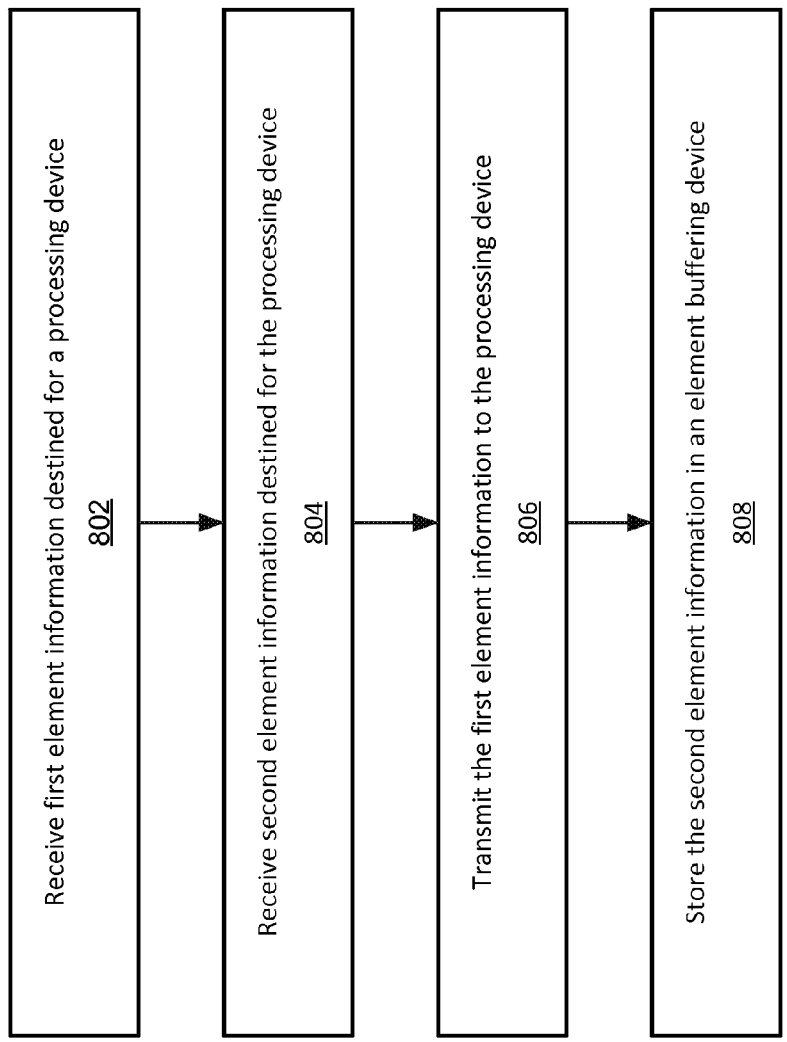

METHOD AND APPARATUS FOR TURBO DECODER MEMORY COLLISION RESOLUTION

BACKGROUND

In typical turbo decoders, a parallel decoding process may be used in which a non-permuted code block containing non-permuted symbols and a permuted code block containing permuted symbols may be divided into multiple sub-blocks, stored in different memory banks, and decoded in parallel using multiple processors. The non-permuted code block may be decoded in this manner because the non-permuted symbols are stored in the memory banks in a linear order.

However, problems may arise when decoding the permuted code block because the permuted symbols are generated on-the-fly, such that the corresponding non-permuted symbols are read from the memory banks and arranged to the permuted positions as required. For example, a collision may arise when two or more symbols must be read from the same memory bank at the same time, resulting in delay and reducing throughput. The number of collisions, and the resulting reduction in throughput, is typically high enough that the throughput requirements of the turbo decoder cannot be met. Typical solutions include using specially designed hardware (e.g., contention-free interleavers that must be part of the standard) or a greater amount of memory banks and processors, both of which have the undesirable effects of increasing the complexity and cost of the turbo decoder.

SUMMARY

Some features described herein relate generally to structures and processes that may decrease the amount of collisions during a process having one or more parallel memory accesses, such as a parallel decoding process. In some aspects, an intermediate buffering device may be introduced between a memory device and a plurality of processing devices. The intermediate buffering device may be capable of, in some instances, reducing memory collisions resulting from the parallel memory accesses and allowing for seamless or quasi-seamless operation of the processing devices.

According to some aspects, an intermediate buffering device is provided that is communicatively coupled to (e.g., between) a plurality of processing devices and a memory device. The intermediate buffering device may include an address buffering device and an element buffering device, which may each be First In, First Out (FIFO) memory devices.

In some arrangements, the intermediate buffering device may be configured to be accessed multiple times during a single hardware cycle of the parallel decoding process. For example, the intermediate buffering device may be configured to receive first address information from one processing device and second address information from another processing device. The first address information may be, for example, a first memory address corresponding to a first element of a code sequence stored in the memory device. The second address information may be, for example, a second memory address corresponding to a second element of the code sequence stored in the memory device. Accordingly, the first address information and the second address information may both be destined for the same memory device.

In some arrangements, the intermediate buffering device may be configured to transmit a request for the first element based on the first address information to the memory device, and to store the second address information in the address buffering device. Subsequently, the intermediate buffering device may be configured to receive first element information corresponding to the first element from the memory device and store the first element information in the element buffering device. In some instances, the intermediate buffering device may be further configured to, during a subsequent hardware cycle of the parallel decoding process, transmit a request for the second element to the memory device, receive second element information corresponding to the second element from the memory device, and store the second element information in the element buffering device together with the first element information.

This summary is not intended to identify critical or essential features of the disclosures herein, but instead merely summarizes certain features and variations thereof. Other details and features will also be described in the sections that follow.

BRIEF DESCRIPTION OF THE DRAWINGS

A more complete understanding of the present disclosure and the potential advantages of various aspects described herein may be acquired by referring to the following description in consideration of the accompanying drawings, in which like reference numbers indicate like features, and wherein:

FIG. 7 illustrates an example process flow for decoding a code sequence; and

FIG. 8 illustrates another example process flow for decoding a code sequence.

DETAILED DESCRIPTION

The devices and/or software described herein may be implemented using one or more processors, integrated circuits (ICs) such as application specific integrated circuits (ASICs), programmable logic devices (PLDs) such as field programmable gate arrays (FPGAs), storage devices (e.g., memory), circuit boards such as printed circuit boards (PCBs), executable instructions, software, and other hardware and/or software elements and combinations thereof. For example, executable instructions and data used by processors and other components may be stored in memory, in hardware logic, or in any other storage device. Memory may include any of various types of tangible machine-readable storage medium, including one or more of the following types of storage devices: read only memory (ROM) modules, random access memory (RAM) modules, magnetic tape, magnetic discs (e.g., a hard disk drive), optical disk (e.g., a CD-ROM disc, a CD-RW disc, a DVD disc), flash memory, phase-change memory, EEPROM memory, and other volatile and non-volatile memories. Software may be stored within memory to provide instructions to the processors and other components such that when the instructions are executed, the processor or other component may be caused to perform the various functions or methods described herein, function as the various devices described herein, or both. Software may include both applications and operating system software, and may include code segments, instructions (e.g., computer readable instructions, computer executable instructions), pre-compiled code, compiled code, computer programs, program modules, engines, program logic, and combinations thereof. For example, software may include the parallel decoding process described herein or another process that includes parallel memory accesses.

The devices and/or components described herein may include one or more communication devices and may be communicatively coupled through one or more communication links Communication devices may include, for example, communication interfaces, filters, amplifiers, splitters, wave guides, transmitters, receivers, transceivers, and other wired or wireless components. Communication links may include, for example, wired communication links such as electrically conductive wires and optical fibers and wireless communication links such as radio frequency (RF) communication links, infrared (IR) communication links, microwave communication links, acoustic communication links, and wireless communication network links (e.g., Wi-Fi).

Figure 1:
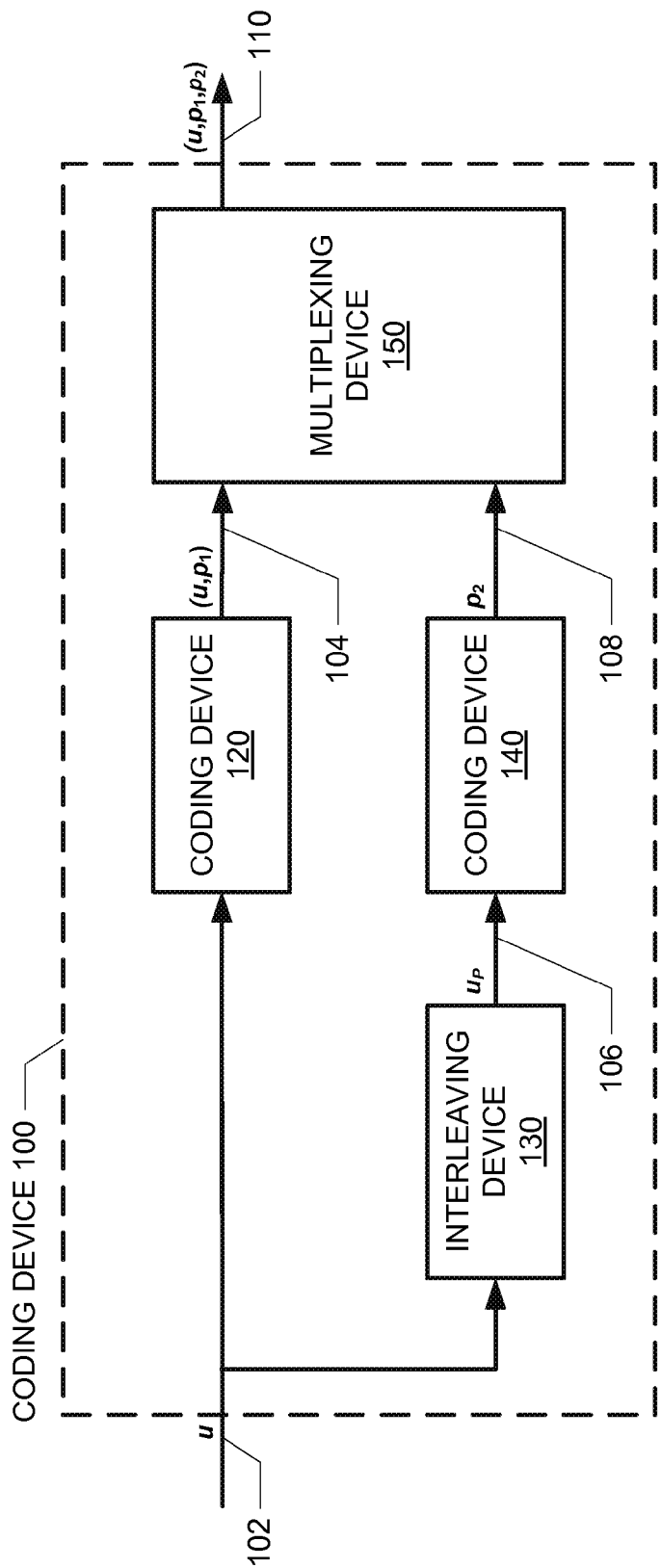
FIG. 1 illustrates an example encoding device.

FIG. 1 illustrates an example coding device 100 for coding an information sequence in accordance with one or more aspects described herein. Coding device 100 may be, for example, a turbo encoder included in or communicatively coupled to a wireless transmitter of a computing device (e.g., mobile phone, tablet computer, vehicular computing system, or any other device or combination of devices). In some aspects, coding device 100 may include more or less components than those illustrated in FIG. 1. In some aspects, the physical arrangement of the components of coding device 100 may differ from FIG. 1. It will be understood that the features described herein are not limited to parallel-concatenated codes (e.g., turbo codes) but may be applicable to other iteratively codable codes such as serially concatenated codes and Low Density Parity Check (LDPC) codes.

Coding device 100 may include hardware, software, or both for coding an information sequence u using a parallel coding process, such as a turbo coding process. For example, coding device 100 may include coding device 120, interleaving device 130, coding device 140, and multiplexing device 150. Information sequence u may be, for example, a discrete information sequence u={u[0], u[1], . . . , u[K−1]} that includes K discrete elements or symbols. In some arrangements, the block size K of the information sequence u may be variable. For example, the block size K may be variable between 40 and 6144 bits for Long Term Evolution (LTE) communications. In another example, the block size K may be variable between 40 and 5114 bits for Universal Mobile Telecommunications System (UMTS) communications.

Coding device 120 may be, for example, a first recursive systematic convolutional (RSC) encoder that codes the information sequence u received via communication link 102 to generate the code sequence $(u,p_1)$ at communication link 104, where $p_1$ is a first parity sequence. Coding device 120 may generate the first parity sequence $p_1$ using, for example, a shift register with feedback.

Interleaving device 130 may be, for example, an interleaver that receives and processes the information sequence u to generate the permuted information sequence $u_P$. Information sequence $u_P$ may be, for example, a discrete information sequence $u_P=\{u_P[0], u_P[1], \ldots, u_P[K-1]\}$ that includes K discrete elements or symbols. In an illustrative example in which K=3, the elements $\{u_P[0], u_P[1], u_P[2]\}$ of the permuted information sequence $u_P$ may respectively correspond to the elements $\{u[2], u[0], u[1]\}$ of the information sequence u. Interleaving device 130 may generate the permuted information sequence $u_P$ by, for example, block-by-block interleaving the information sequence u. Interleaving device 130 may then output the permuted information sequence $u_P$ at communication link 106.

Coding device 140 may be, for example, a second RSC encoder that codes the permuted information sequence $u_P$ received via communication link 106 to generate a second parity sequence $p_2$ at communication link 108. Coding device 140 may generate the second parity sequence $p_2$ using, for example, a shift register with feedback. In some arrangements, coding device 140 may generate the second parity sequence $p_2$ at communication link 108 by excluding the permuted information sequence $u_P$ from the code sequence $(u_P,p_2)$.

The code sequence $(u,p_1)$ at communication link 104 and the second parity sequence $p_2$ at communication link 108 may be transmitted to multiplexing device 150. Multiplexing device 150 may be, for example, a multiplexer (MUX) that combines the code sequence $(u,p_1)$ and the second parity sequence $p_2$ to generate the code sequence $(u,p_1,p_2)$ at communication link 110. In some arrangements, coding device 100 may include a puncturer for puncturing $p_1$ and $p_2$ to, in some instances, increase the rate of transmission (e.g., from a code rate of 1/3 to a code rate of 1/2).

Coding device 100 may transmit the code sequence $(u,p_1,p_2)$ to another device at communication link 110. Communication link 110 may be, for example, a transmission channel such as an air interface. For example, coding device 100 may modulate the code sequence $(u,p_1,p_2)$ onto a carrier and transmit the modulated code sequence over communication link 110. In some embodiments, coding device 100 may transmit the code sequence $(u,p_1,p_2)$ to a decoding device, such as decoding device 200 shown in FIG. 2, via one or more intermediate devices configured to perform rate matching, interleaving and modulation.

Figure 2:
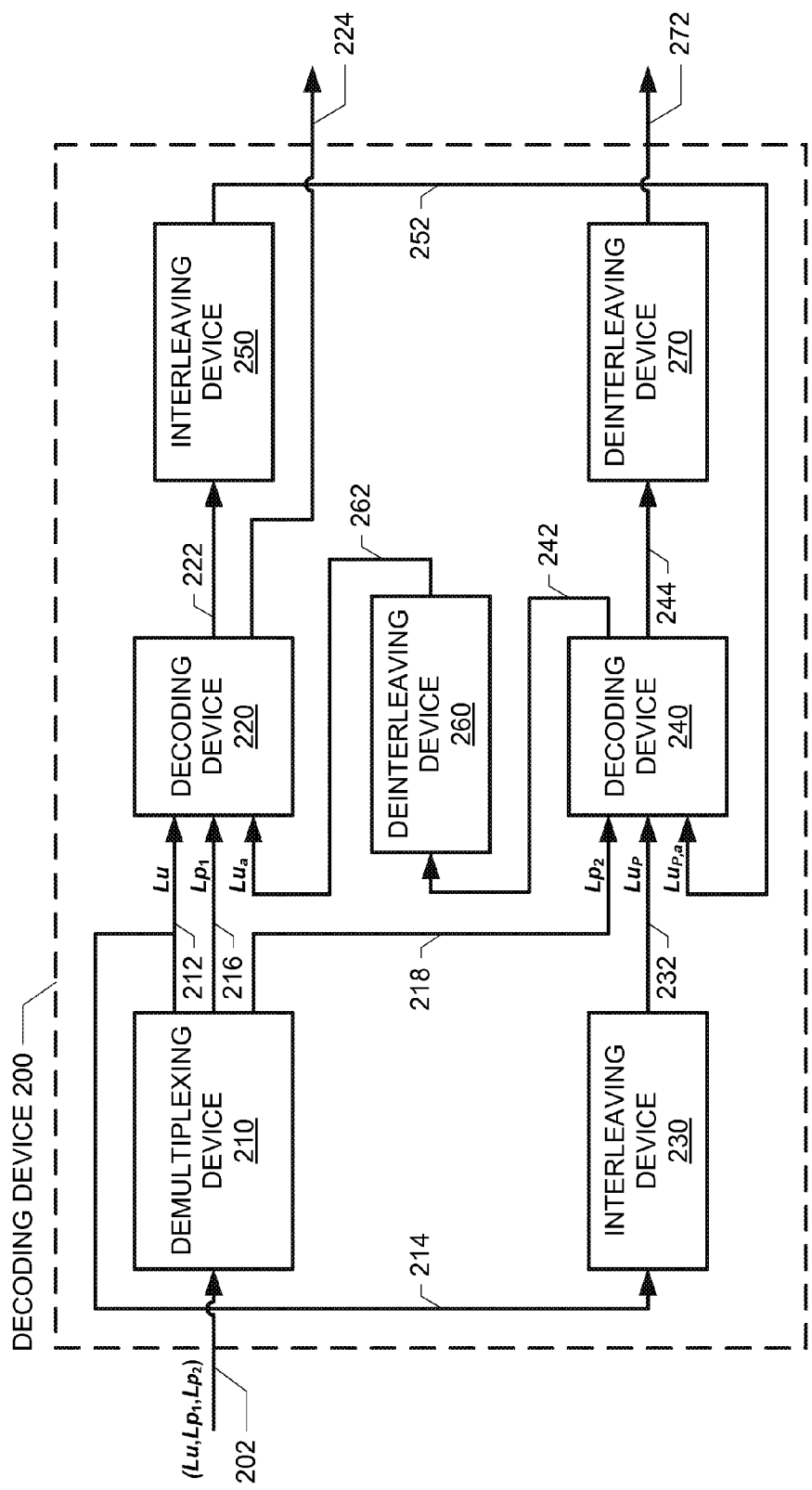
FIG. 2 illustrates an example decoding device.

FIG. 2 illustrates an example decoding device 200 for decoding a code sequence in accordance with one or more aspects described herein. Decoding device 200 may be, for example, a turbo decoder included in or communicatively coupled to a wireless receiver of a computing device. In some aspects, decoding device 200 may include more or less components than those illustrated in FIG. 2. In some aspects, the physical arrangement of the components of decoding device 200 may differ from FIG. 2. It will be understood that the features described herein are not limited to parallel-concatenated codes (e.g., turbo codes) but may be applicable to other iteratively decodable codes such as serially concatenated codes and Low Density Parity Check (LDPC) codes.

Decoding device 200 may include hardware, software, or both for decoding a received code sequence Lu using an iterative decoding process, such as a turbo decoding process. For example, decoding device 200 may include demultiplexing device 210, decoding devices 220 and 240, interleaving devices 230 and 250, and deinterleaving devices 260 and 270. Code sequence Lu may be, for example, a sequence of real or fixpoint values, such as log-likelihood ratio (LLR) values (i.e., soft bits). For example, code sequence Lu may be a sequence Lu={Lu[0], Lu[1], . . . , Lu[K−1]} that includes K LLR values, where K is the code block size. An LLR value may correspond to the logarithm of the ratio between the probability of a logic 0 and the probability of a logic 1, or vice versa. For example, the LLR value of the element Lu[0] may indicate the probability of the element Lu[0] corresponding to either a logic 0 or a logic 1.

Decoding device 200 may receive the code sequence (Lu, $Lp_1,Lp_2$) at communication link 202. Communication link 202 may be, for example, a transmission channel such as an air interface. The code sequence $(Lu,Lp_1,Lp_2)$ may be received from, for example, a device such as coding device 100 or an intermediate device communicatively coupled thereto. For example, decoding device 200 may receive a modulated code sequence at communication link 202 and demodulate the received sequence to generate the code sequence ($Lu, Lp_1, Lp_2$). The code sequence ($Lu, Lp_1, Lp_2$) may include, for example, three sequences of LLR values. For example, the LLR values of the sequences $Lu$, $Lp_1$, and $Lp_2$ may respectively correspond to the elements of sequences $u$, $p_1$, and $p_2$ described with reference to FIG. 1.

Decoding device 200 may transmit the code sequence ($Lu, Lp_1, Lp_2$) to demultiplexing device 210. Demultiplexing device 210 may be, for example, a demultiplexer (DEMUX) that processes the code sequence ($Lu, Lp_1, Lp_2$) to generate and output the code sequences $Lu$, $Lp_1$, and $Lp_2$. Demultiplexing device 210 may transmit the code sequences $Lu$ and $Lp_1$ to decoding device 220 at communication links 212 and 216, respectively. Demultiplexing device 210 may transmit the code sequence $Lp_2$ to decoding device 240 at communication link 218.

Demultiplexing device 210 may transmit the code sequence $Lu$ to interleaving device 230 at communication link 214. Interleaving device 230 may be, for example, an interleaver that receives and processes the code sequence $Lu$ to generate the permuted code sequence $Lu_P$. Interleaving device 230 may transmit the permuted code sequence $Lu_P$ to decoding device 240 at communication link 232.

Decoding device 220 may be, for example, a first Soft-In-Soft-Out (SISO) decoder that receives the code sequence $Lu$ at communication link 212, the parity sequence $Lp_1$ at communication link 216, and the a priori sequence $Lu_a$ at communication link 262. Decoding device 220 may process the received sequences $Lu$, $Lp_1$, and $Lu_a$ to generate an extrinsic sequence at communication link 222 and an a posteriori sequence at communication link 224. In one example, decoding device 220 may process the code sequences $Lu$, $Lp_1$, and $Lu_a$ using a maximum a posteriori (MAP) technique such as a symbol-by-symbol a posteriori probability (s/s APP) decoding process. In another example, decoding device 220 may process the code sequences $Lu$, $Lp_1$, and $Lu_a$ using a Soft Output Viterbi Algorithm (SOVA).

The extrinsic sequence output at communication link 222 may include, for example, information generated during a respective half-iteration (e.g., i) and may be indicative of the convergence of the decoding process. A half-iteration corresponds to a decoding step performed by a decoding device (e.g., one of decoding devices 220 and 240), and one iteration includes two half-iterations (e.g., one half-iteration performed by decoding device 220 and one half-iteration performed by decoding device 240). Decoding device 220 may transmit the extrinsic sequence to interleaving device 250 at communication link 222. Interleaving device 250 may be, for example, an interleaver that receives and processes the extrinsic sequence to generate the permuted a priori sequence $Lu_{P,a}$. Interleaving device 230 may transmit the permuted a priori sequence $Lu_{P,a}$ to decoding device 240 at communication link 252, which may be used as a priori information during the subsequent half-iteration (e.g., i+1).

The a posteriori sequence output at communication link 224 may include LLR values corresponding to the information sequence $u$ described with reference to FIG. 1. For example, a computing device may receive the a posteriori sequence output at communication link 224 and determine the binary elements of the information sequence $u$ based on the mathematical signs of the a posteriori LLR values.

Decoding device 240 may be, for example, a second Soft-In-Soft-Out (SISO) decoder that receives the permuted code sequence $Lu_P$ at communication link 232, the parity sequence $Lp_2$ at communication link 218, and the permuted a priori sequence $Lu_{P,a}$ at communication link 252. Decoding device 240 may process the received sequences $Lu_P$, $Lp_2$, and $Lu_{P,a}$ to generate a permuted extrinsic sequence at communication link 242 and a permuted a posteriori sequence at communication link 244. For example, decoding device 240 may process the code sequences $Lu_P$, $Lp_2$, and $Lu_{P,a}$ using a MAP or SOVA technique.

The permuted extrinsic sequence output at communication link 242 may include, for example, information generated during a respective half-iteration and may be indicative of the convergence of the decoding process. Decoding device 240 may transmit the permuted extrinsic sequence to deinterleaving device 260 at communication link 242. Deinterleaving device 260 may be, for example, a deinterleaver that receives and processes the permuted extrinsic sequence to generate the a priori sequence $Lu_a$. Deinterleaving device 260 may transmit the a priori sequence $Lu_a$ to decoding device 220 at communication link 262, which may be used as a priori information during the subsequent half-iteration.

Decoding device 240 may transmit the permuted a posteriori sequence to deinterleaving device 270 at communication link 244. Deinterleaving device 270 may be, for example, a deinterleaver that receives and processes the permuted a posteriori sequence to generate a non-permuted a posteriori sequence. Interleaving device 270 may output the a posteriori sequence at communication link 272.

The a posteriori sequence output at communication link 272 may include LLR values corresponding to the information sequence $u$ described with reference to FIG. 1. For example, a computing device may receive the a posteriori sequence output at communication link 272 and determine the binary elements of the information sequence $u$ based on the mathematical signs of the a posteriori LLR values.

The reliability of the a posteriori sequences output at communication links 224 and 272 may, in some instances, increase with each half-iteration until the decoding process has converged or a predetermined number of iterations has been reached. For example, the magnitude of each of the LLR values of the a posteriori sequences may become greater with each half-iteration.

In some embodiments, the decoding process implemented by decoding device 200 may be a parallel decoding process (or another process that includes parallel memory accesses) that utilizes parallel processing devices. These processing devices may be referred to herein as workers or parallel workers. For example, a parallel decoding process may be used in which a first code block containing the LLR values of the code sequence $Lu$ and a second code block containing the permuted LLR values of the permuted code sequence $Lu_P$ may be divided into multiple sub-blocks (e.g., code sequences of length $K_{sub} < K$, where $K_{sub}$ represents the number of LLR values in the sub-block). The sub-blocks may be stored in different memory devices and decoded in parallel using multiple processing devices. For example, decoding device 220, decoding device 240, or both may process the sub-blocks in parallel using two or more processing devices and one or more memory devices.

In certain implementations, decoding device 220 may process and store the LLR values of the non-permuted code sequence ($Lu, Lp_1$) in a linear order. Decoding device 240 may process the elements (e.g., LLR values) of the permuted code sequence ($Lu_P, Lp_2$) by reading the corresponding non-permuted elements from the memory device or devices in which they are stored and arranging them to their permuted positions. Memory collisions may be reduced, in some instances, by using intermediate buffering devices communicatively coupled to the one or more memory devices and the processing devices of one or both of decoding devices 220 and 240. Intermediate buffering devices are described in greater detail with reference to FIGS. 3-6.

Figure 3:
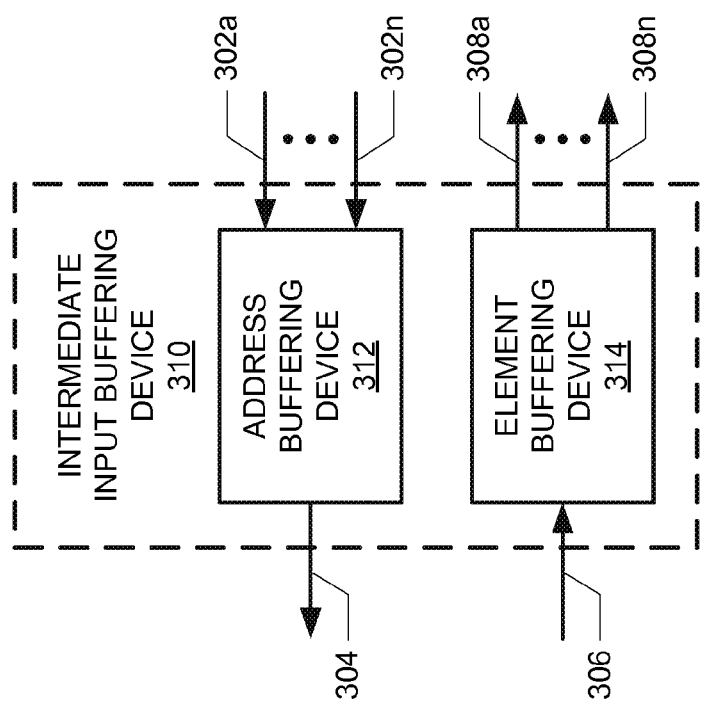
FIG. 3 illustrates an example intermediate buffering device.

FIG. 3 illustrates an example intermediate input buffering device for reading information from the memory devices of a decoding device, such as decoding device 200, during a process having one or more parallel memory accesses, such as the parallel decoding process described herein. For example, decoding device 200 may include one or more intermediate input buffering devices such as intermediate input buffering device 310, where each intermediate input buffering device may be communicatively coupled to a memory device (e.g., at communication links 304 and 306) and a plurality of processing devices (e.g., at communication links 302a-n and 308a-n).

Intermediate input buffering device 310 may include address buffering device 312 and element buffering device 314. In some instances, address buffering device 312 and element buffering device 314 may be configured to be accessed multiple times during a single cycle of the parallel decoding process. In an example, when intermediate input buffering device 310 receives, during a single cycle, requests (e.g., address information such as memory addresses) for two or more elements stored in a single memory device, intermediate input buffering device 310 may read one of the elements from the memory device, store the remainder of requests in a pre-determined order, and read the corresponding elements from the memory device during subsequent cycles. The order for storing the requests and reading the elements from the memory device may be pre-defined. The same order may be used at a later point in time for transmitting the elements to the processing devices that requested them (e.g., after a pre-run process of 2 hardware cycles).

Address buffering device 312 may include any suitable hardware, software, or both for receiving, storing, and transmitting information destined for a memory device, such as address information corresponding to one or more elements of a code sequence stored in the memory device. Address buffering device 312 may be, for example, a First In, First Out (FIFO) memory device. Address information may include, for example, information indicative of an address of, or a request for, a particular element or symbol of an code sequence. For example, address information may include a memory address for an element stored in the memory device.

Element buffering device 314 may include any suitable hardware, software, or both for receiving, storing, and transmitting information destined for the plurality of processing devices, such as element information corresponding to one or more elements of a code sequence stored in the memory device. Element buffering device 314 may be, for example, a FIFO memory device. Element information may include, for example, information indicative of a particular LLR value of a code sequence. For example, intermediate input buffering device 310 may receive element information from the memory device at communication link 306 and store the element information in element buffering device 314.

In some embodiments, intermediate input buffering device 310 may include, or be communicatively coupled to, a logic device (e.g., a logic device for priority handling) communicatively coupled to one of the plurality of processing devices and one or more other intermediate input buffering devices and configured to receive element information from intermediate input buffering device 310 and the one or more other intermediate input buffering devices and transmit the received element information to the processing device in a predetermined order.

In an illustrative example, during a cycle of the parallel decoding process, intermediate input buffering device 310 may receive, at communication link 306, element information corresponding to a first element of a code sequence and store the element information corresponding to the first element in element buffering device 314. During the next cycle of the parallel decoding process, intermediate input buffering device 310 may receive, at communication link 306, element information corresponding to a second element of the code sequence and store the element information corresponding to the second element in element buffering device 314. Subsequently, during the next cycle of the parallel decoding process, intermediate input buffering device 310 may transmit the element information corresponding to the first element of the code sequence to a first processing device (e.g., at communication link 308a) and transmit the element information corresponding to the second element of the code sequence to a second processing device (e.g., at communication link 308n).

Figure 4:
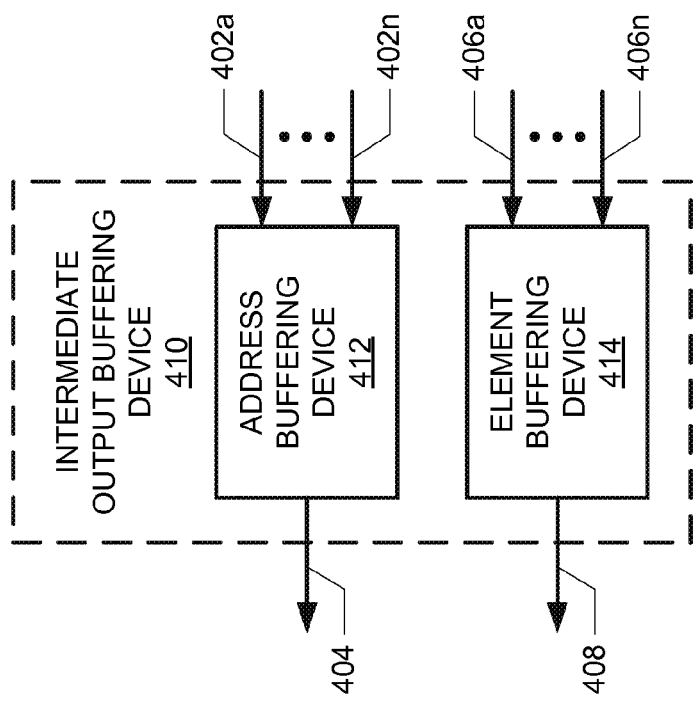
FIG. 4 illustrates another example intermediate buffering device.

FIG. 4 illustrates an example intermediate output buffering device for writing (e.g., storing) information to the memory devices of a decoding device, such as decoding device 200, during a process having one or more parallel memory accesses, such as the parallel decoding process described herein. For example, decoding device 200 may include one or more intermediate output buffering devices such as intermediate output buffering device 410, where each intermediate input buffering device may be communicatively coupled to a memory device (e.g., at communication links 404 and 408) and a plurality of processing devices (e.g., at communication links 402a-n and 406a-n). In some embodiments, intermediate output buffering device 410 may include any combination of features discussed with reference to intermediate input buffering device 310 in addition to the features discussed with reference to FIG. 4.

Intermediate output buffering device 410 may include address buffering device 412 and element buffering device 414. In some embodiments, address buffering device 412 and element buffering device 414 may include any combination of features discussed with reference to address buffering device 312 and element buffering device 314 in addition to the features discussed with reference to FIG. 4.

In an illustrative example, during a cycle of the parallel decoding process, one of the plurality of processing devices may generate element information and address information corresponding to an element of a code sequence. The processing device may transmit the element information and the address information to the intermediate output buffering device communicatively coupled to the memory device in which the information is to be written. For example, intermediate output buffering device 410 may be communicatively coupled to the memory device associated with the element information and address information generated by the processing device. Intermediate output buffering device 410 may receive the address information at communication link 402a and the element information at communication link 406a.

In one example, intermediate output buffering device 410 may determine that no element information is stored in element buffering device 414 and that no information is received from another processing device. In response, intermediate output buffering device 410 may transmit the address information and the element information directly to the memory device (e.g., at communication links 404 and 408, respectively). The memory device may then write the received element information to the memory address corresponding to the received address information.

In another example, intermediate output buffering device 410 may determine that element information is stored in element buffering device 414. In response, intermediate output buffering device 410 may store the address information and the element information directly in element buffering device 414.

In another example, intermediate output buffering device 410 may determine that no element information is stored in element buffering device 414 but that information (e.g., element information and address information) is received from another processing device. In response, intermediate output buffering device 410 may transmit the address information and the element information corresponding to the stored element information to the memory device (e.g., at communication links 404 and 408, respectively). Intermediate output buffering device 410 may then store the address information received from the other processing device in address buffering device 412 and the element information received from the other processing device in element buffering device 414.

Figure 5:
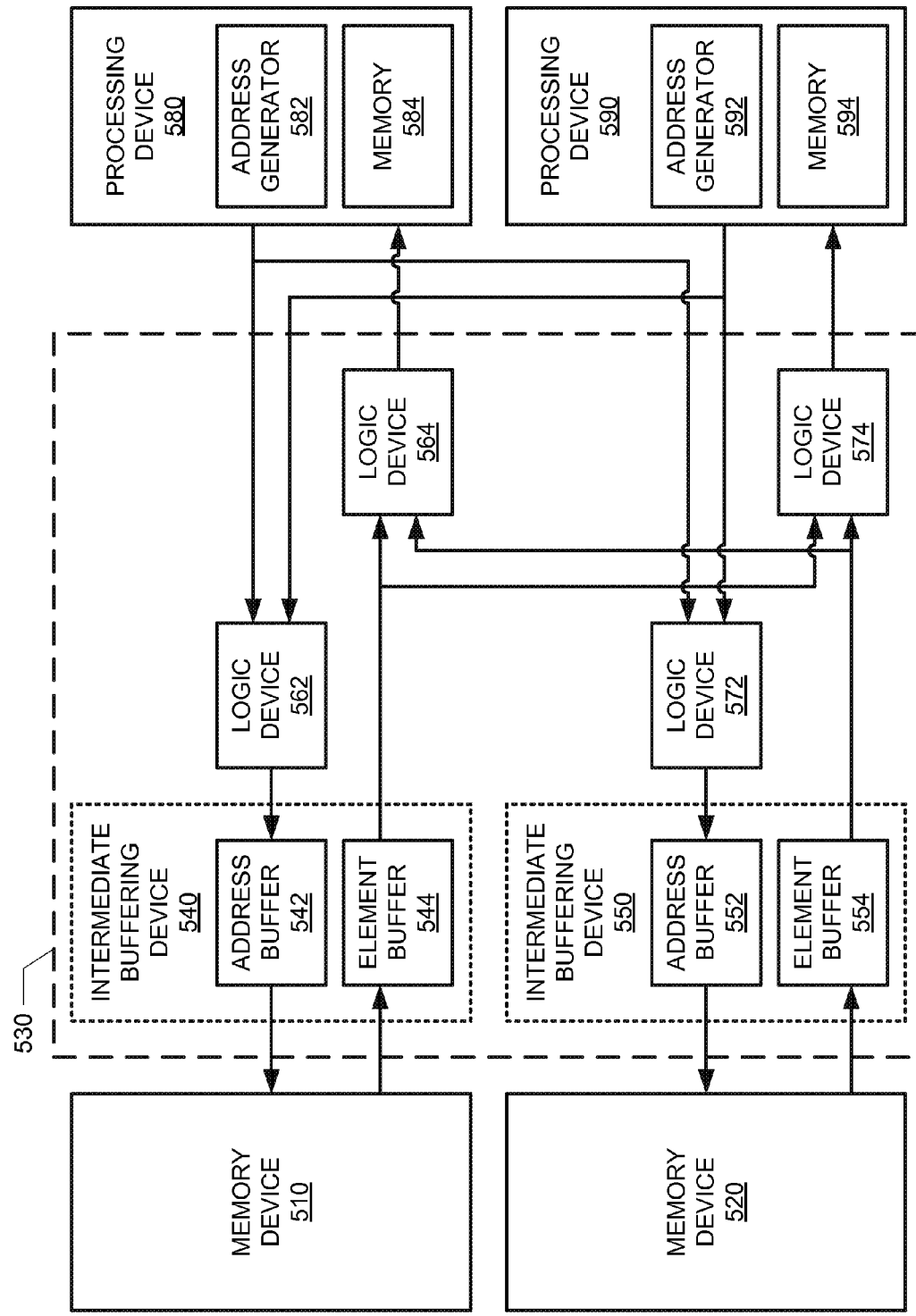
FIG. 5 illustrates an example configuration for decoding a code sequence.

FIG. 5 illustrates an example system for decoding a code sequence in accordance with one or more aspects described herein. In some embodiments, the example system of FIG. 5 may be included in a decoding device, such as decoding device 200, for decoding a code sequence, such as the permuted code sequence ($Lu_P, Lp_2$). In some aspects, the example system may include more or less components than those illustrated in FIG. 5. In some aspects, the physical arrangement of the components of the example system may differ from FIG. 5.

The example system of FIG. 5 may include as many parallel intermediate buffering devices as parallel memory devices, and at least as many parallel memory devices as parallel processor devices. In one example, the example system of FIG. 5 may include memory devices 510 and 520, processing devices 580 and 590, and device 530 communicatively coupled between the memory devices 510 and 520 and the processing devices 580 and 590. Accordingly, device 530 may include intermediate buffering devices 540 and 550.

Memory devices 510 and 520 may include any suitable hardware, software, or both for receiving, storing, and transmitting element information corresponding to elements of a code sequence. For example, memory device 510 may store element information corresponding to elements of a first sub-block of a code sequence (e.g., ($Lu, Lp_1$)), and memory device 520 may store element information corresponding to elements of a second sub-block of the code sequence.

Processing devices 580 and 590 may include any suitable hardware, software, or both for generating and transmitting address information and receiving, storing, and transmitting element information corresponding to elements of a code sequence. For example, processing device 580 may include address generator 582 for generating address information corresponding to elements of a first sub-block of a permuted code sequence (e.g., ($Lu_P, Lp_2$)), and processing device 590 may include address generator 592 for generating address information corresponding to elements of a second sub-block of the permuted code sequence. Processing device 580 may also include memory 584 for storing element information corresponding to elements of the first sub-block of the permuted code sequence, and processing device 590 may include memory 594 for storing element information corresponding to elements of the second sub-block of the permuted code sequence. In some implementations, processing devices 580 and 590 may further include logic devices for performing APP decoding, such as branch metric computation units, forward recursion units, backward recursion units, a posteriori information processing units, extrinsic information processing units, and any other devices or combinations thereof.

Device 530 may include any suitable hardware, software, or both for providing intermediate buffering as described herein. For example, device 530 may include intermediate buffering device 540, intermediate buffering device 550, and logic devices 562, 564, 572, and 574.

Intermediate buffering device 540 may be communicatively coupled to memory device 510 and processing devices 580 and 590. Intermediate buffering device 550 may be communicatively coupled to memory device 520 and processing devices 580 and 590. In some instances, intermediate buffering device 540 and intermediate buffering device 550 may include any of the features discussed with reference to intermediate input buffering device 310. For example, intermediate buffering device 540 may include address buffering device 542 and element buffering device 544, and intermediate buffering device 550 may include address buffering device 552 and element buffering device 554. In some instances, address buffering device 542 and address buffering device 552 may include any of the features discussed with reference to address buffering device 312. In some instances, element buffering device 544 and element buffering device 554 may include any of the features discussed with reference to element buffering device 314.

Logic device 562 (e.g., a logic device for priority handling) may be communicatively coupled to address buffering device 542 and processing devices 580 and 590. Logic device 562 may be configured to receive address information from processing devices 580 and 590 (e.g., address information generated by address generators 582 and 592, respectively) and transmit the received address information to address buffering device 542 in a predetermined order. Logic device 572 (e.g., a logic device for priority handling) may be communicatively coupled to address buffering device 552 and processing devices 580 and 590. Logic device 572 may be configured to receive address information from processing devices 580 and 590 and transmit the received address information to address buffering device 552 in a predetermined order.

Logic device 564 (e.g., a logic device for priority handling) may be communicatively coupled to processing device 580 and element buffering devices 544 and 554. Logic device 564 may be configured to receive element information from element buffering devices 544 and 554 (e.g., corresponding to element information stored in memory devices 510 and 520, respectively) and transmit the received element information to processing device 580 in a predetermined order. Logic device 574 (e.g., a logic device for priority handling) may be communicatively coupled to processing device 590 and element buffering devices 544 and 554. Logic device 574 may be configured to receive element information from element buffering devices 544 and 554 and transmit the received element information to processing device 590 in a predetermined order.

FIGS. 6a-6f illustrate an example technique for decoding a code sequence using, for example, the example system described with reference to FIG. 5.

Figure 6A:
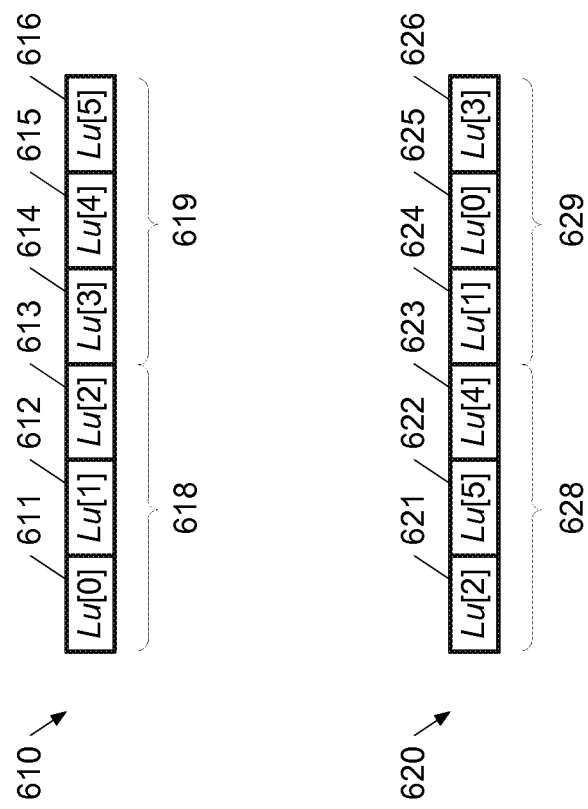
FIG. 6 illustrates an example technique for decoding a code sequence.

As illustrated in FIG. 6a, code sequence 610 may be a non-permuted code sequence (e.g., Lu) that includes six elements (e.g., K=6). For example, code sequence 610 may include element 611 (e.g., Lu[0]), element 612 (e.g., Lu[1]), element 613 (e.g., Lu[2]), element 614 (e.g., Lu[3]), element 615 (e.g., Lu[4]), and element 616 (e.g., Lu[5]). Each element may be associated with address information and element information. Code sequence 610 may be divided into sub-block 618 (e.g., elements 611, 612, and 613) and sub-block 619 (e.g., elements 614, 615, and 616). Elements corresponding to sub-block 618 may be stored in one memory device (e.g., memory device 510), and elements corresponding to sub-block 619 may be stored in another memory device (e.g., memory device 520).

Code sequence 620 may be a permuted code sequence (e.g., $Lu_P$) that includes the permuted elements of code sequence 610. For example, code sequence 620 may include element 621 (e.g., Lu[2] corresponding to element 613), element 622 (e.g., Lu[5] corresponding to element 616), element 623 (e.g., Lu [4] corresponding to element 615), element 624 (e.g., Lu[1] corresponding to element 612), element 625 (e.g., Lu [0] corresponding to element 611), and element 626 (e.g., Lu[3] corresponding to element 614). Code sequence 610 may be divided into sub-block 628 (e.g., elements 621, 622, and 623) and sub-block 629 (e.g., elements 624, 625, and 626). Elements corresponding to sub-block 628 may be requested and processed by one processing device (e.g., processing device 580), and elements corresponding to sub-block 629 may be requested and processed by another processing device (e.g., processing device 590).

Figure 6B:
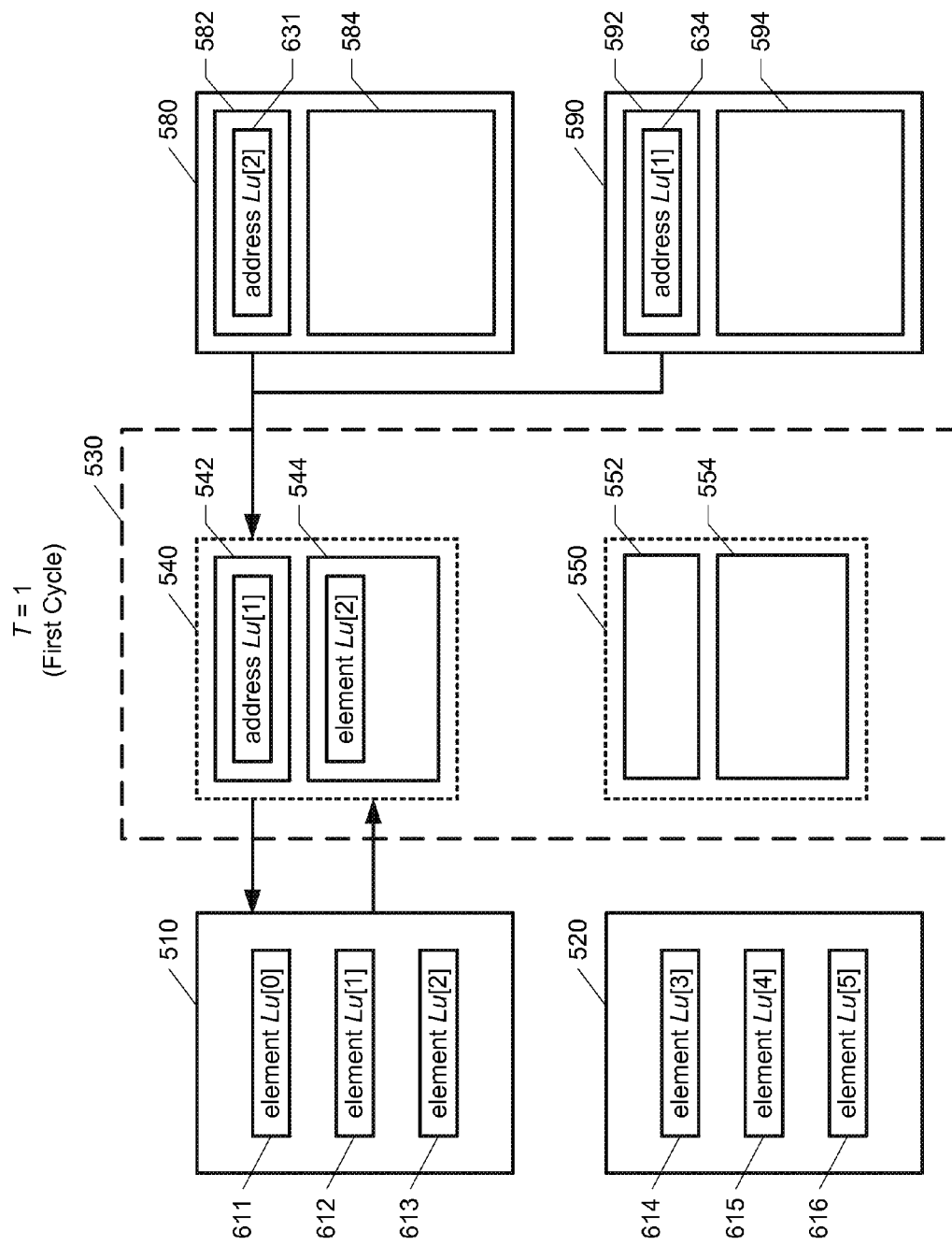

As illustrated in FIG. 6b, during a first hardware cycle (e.g., T=1) of the parallel decoding process, address generator 582 may generate address information 631 corresponding to element 621 (e.g., Lu[2] corresponding to element 613), and address generator 592 may generate address information 634 corresponding to element 624 (e.g., Lu[1] corresponding to element 612).

Address generators 582 and 592 may transmit the address information 631 and 634, respectively, to intermediate buffering device 540 because elements 613 and 612 are stored in memory device 510. Intermediate buffering device 540 may transmit address information 631 (or a request for element 621 or 613) to memory device 510 and store address information 634 in address buffering device 542. In response to the transmission, intermediate buffering device 540 may receive element information (e.g., corresponding to element 613) and store the received element information in element buffering device 544.

After one cycle, intermediate buffering device 540 may store element information corresponding to element 613 and address information 634, while intermediate buffering device 550 may store no element information and no address information.

Figure 6C:
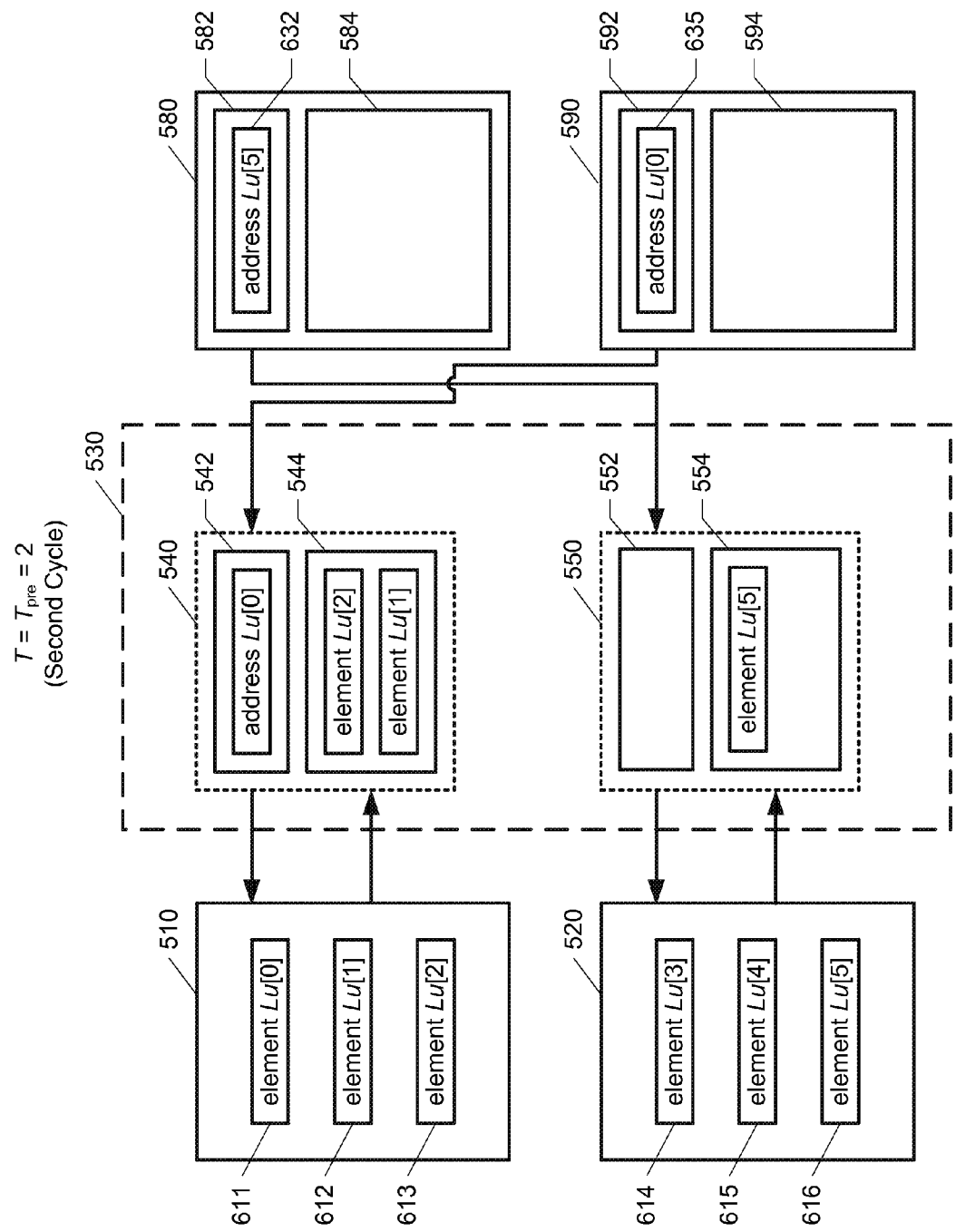

As illustrated in FIG. 6c, during a second hardware cycle (e.g., T=2) of the parallel decoding process, address generator 582 may generate address information 632 corresponding to element 622 (e.g., Lu[5] corresponding to element 616), and address generator 592 may generate address information 635 corresponding to element 625 (e.g., Lu[0] corresponding to element 611).

Address generator 582 may transmit the address information 632 to intermediate buffering device 550 because element 616 is stored in memory device 510. Intermediate buffering device 540 may transmit address information 634 (or a request for element 624 or 612) to memory device 510 and store address information 632 in address buffering device 542. In response to the transmission, intermediate buffering device 540 may receive element information (e.g., corresponding to element 612) and store the received element information in element buffering device 544.

Address generator 592 may transmit the address information 635 to intermediate buffering device 550 because element 611 is stored in memory device 520. Intermediate buffering device 550 may transmit address information 635 (or a request for element 625 or 616) to memory device 520 and, in response, receive element information (e.g., corresponding to element 616) and store the received element information in element buffering device 554.

After two cycles, intermediate buffering device 540 may store element information corresponding to the elements 613 and 612 and address information 635, while intermediate buffering device 550 may store element information corresponding to the element 616 and no address information. In some instances, the first hardware cycle (e.g., T=1) and the second hardware cycle (e.g., T=2) described above may be included in a pre-run process of the parallel decoding process, which may be denoted as $T_{pre}=2$ cycles.

Figure 6D:
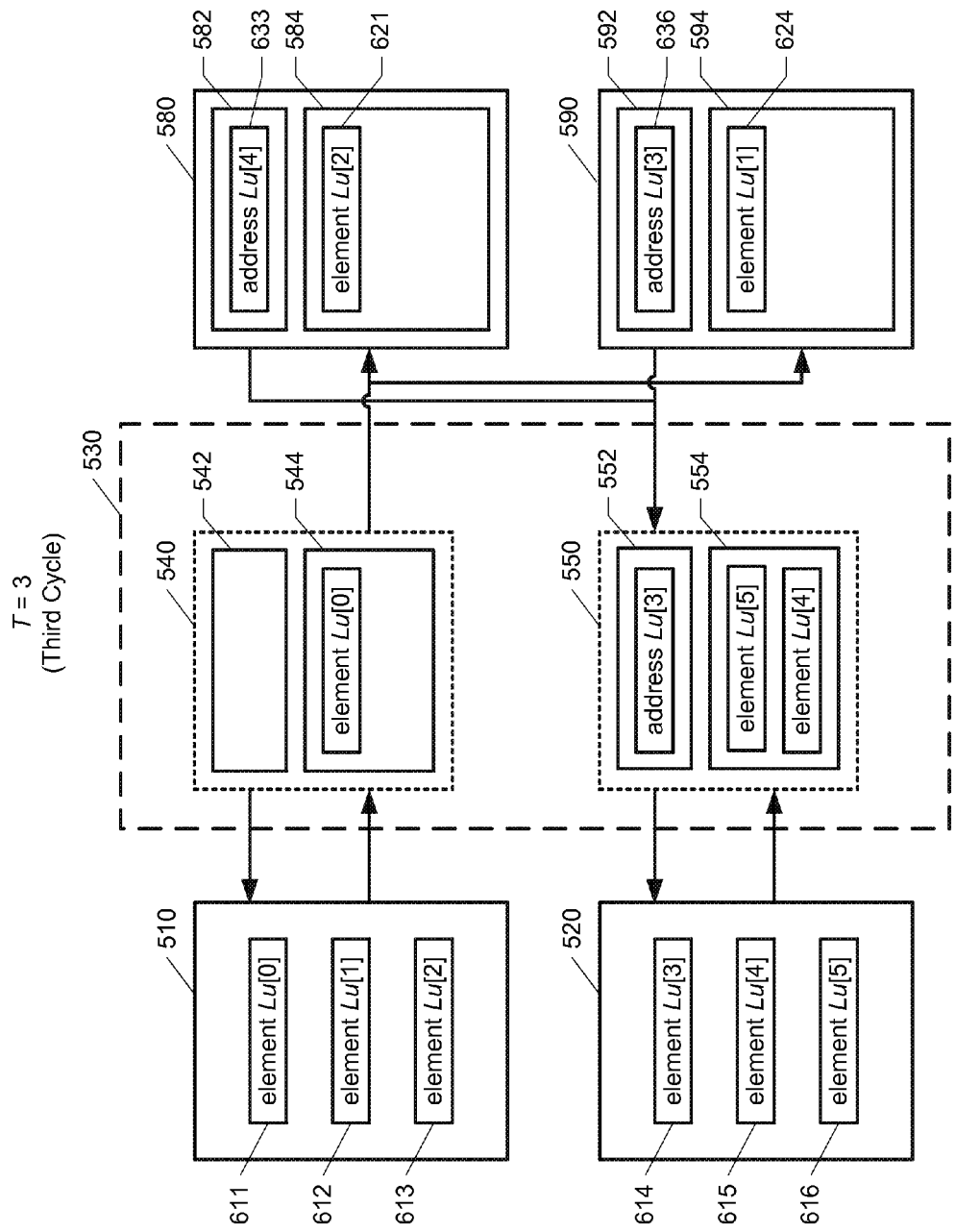

As illustrated in FIG. 6d, during a third hardware cycle (e.g., T=3) of the parallel decoding process, address generator 582 may generate address information 633 corresponding to element 623 (e.g., Lu[4] corresponding to element 615), and address generator 592 may generate address information 636 corresponding to element 626 (e.g., Lu[3] corresponding to element 614).

Address generators 582 and 592 may transmit the address information 633 and 636, respectively, to intermediate buffering device 550 because elements 615 and 614 are stored in memory device 520. Intermediate buffering device 550 may transmit address information 633 (or a request for element 623 or 615) to memory device 520 and store address information 636 in address buffering device 552. In response to the transmission, intermediate buffering device 550 may receive element information (e.g., corresponding to element 615) and store the received element information in element buffering device 554.

Intermediate buffering device 540 may transmit address information 635 (or a request for element 625 or 611) to memory device 510 and, in response, receive element information (e.g., corresponding to element 611) and store the received element information in element buffering device 544. Intermediate buffering device 540 may transmit element information corresponding to element 613 to processing device 580, which may receive and store the element information as element information 621. Intermediate buffering device 540 may transmit element information corresponding to element 612 to processing device 590, which may receive and store the element information as element information 624.

After three cycles, intermediate buffering device 540 may store element information corresponding to element 611 and no address information, while intermediate buffering device 550 may store element information corresponding to the elements 616 and 615 and address information 636.

Figure 6E:
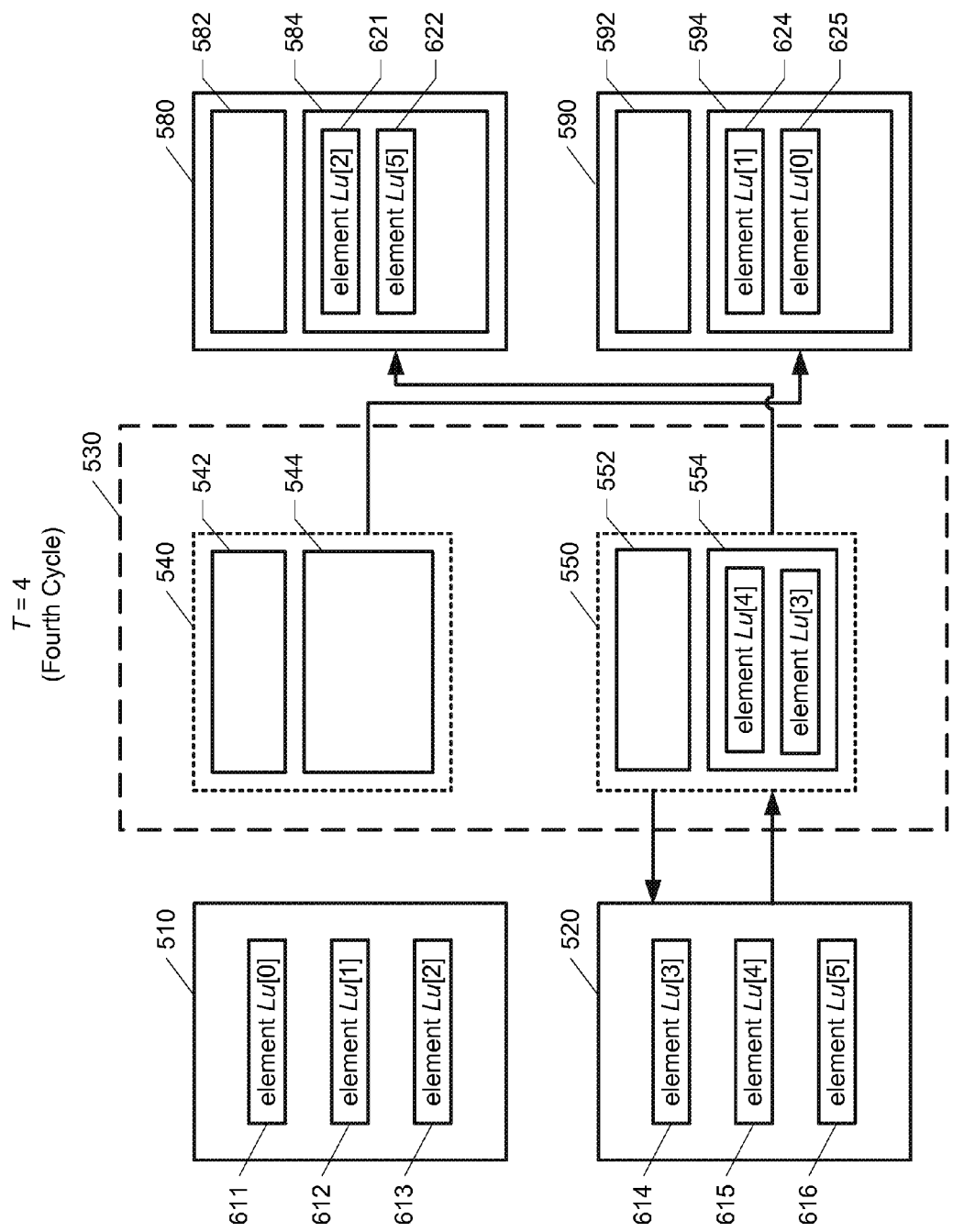

As illustrated in FIG. 6e, during a fourth hardware cycle (e.g., T=4) of the parallel decoding process, intermediate buffering device 540 may transmit element information corresponding to element 611 to processing device 590, which may receive and store the element information as element information 625.

Intermediate buffering device 550 may transmit address information 636 (or a request for element 626 or 614) to memory device 520 and, in response, receive element information (e.g., corresponding to element 614) and store the received element information in element buffering device 554. Intermediate buffering device 550 may transmit element information corresponding to element 616 to processing device 580, which may receive and store the element information as element information 622.

After four cycles, intermediate buffering device 540 may store no element information and no address information, while intermediate buffering device 550 may store element information corresponding to the elements 615 and 614 and no address information.

Figure 6F:
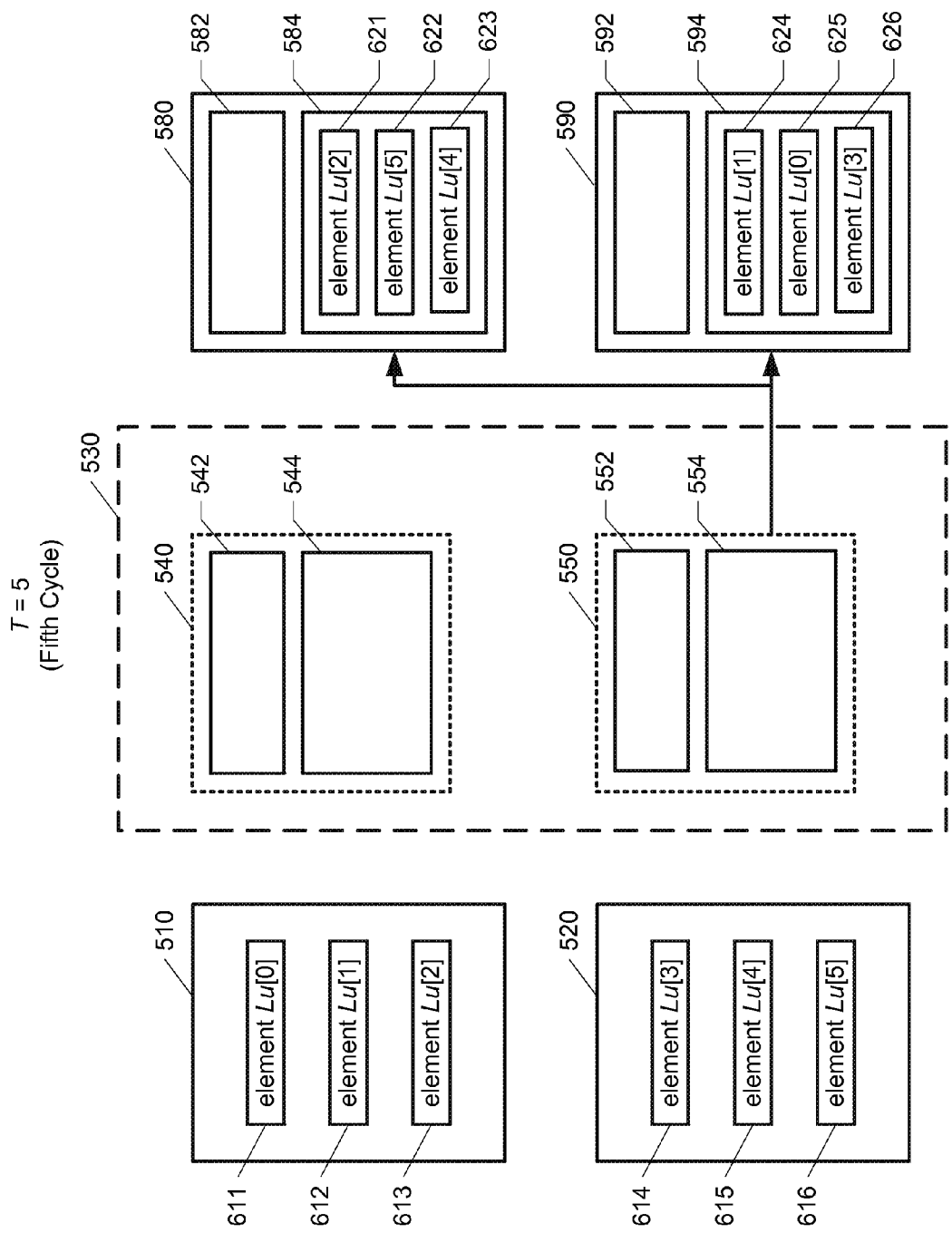

As illustrated in FIG. 6*f*, during a fifth hardware cycle (e.g., T=5) of the parallel decoding process, intermediate buffering device 550 may transmit element information corresponding to element 615 to processing device 580, which may receive and store the element information as element information 623. Intermediate buffering device 550 may transmit element information corresponding to element 614 to processing device 590, which may receive and store the element information as element information 626.

FIG. 7 illustrates an example process flow for transmitting information, such as address information, to a memory device (e.g., memory device 510, memory device 520) during a cycle of the parallel decoding process described herein. Some aspects of the example process flow may include aspects described with reference to FIGS. 1-6. Also, while the steps discussed with regard to FIG. 7 will reference the example system of FIG. 5, this is only an example; these or similar steps may also be performed on variations of that system.

At step 702, an intermediate buffering device (e.g., device 530, intermediate buffering device 540, intermediate buffering device 550) receives first address information destined for a memory device. The first address information may correspond to a first element of a code sequence stored in the memory device and may be received from a first processing device (e.g., processing device 580).

At step 704, the intermediate buffering device receives second address information destined for the memory device. The second address information may correspond to a second element of the code sequence stored in the memory device and may be received from a second processing device (e.g., processing device 590).

At step 706, the intermediate buffering device transmits a request to the memory device based on the first address information. For example, the intermediate buffering device may transmit, to the memory device, the first address information or a request for the element corresponding to the first address information.

At step 708, the intermediate buffering device stores the second address information in an address buffering device (e.g., address buffering device 542, address buffering device 552).

FIG. 8 illustrates an example process flow for transmitting information, such as element information, to a processing device (e.g., processing device 580, processing device 590) during a cycle of the parallel decoding process described herein. Some aspects of the example process flow may include aspects described with reference to FIGS. 1-6. Also, while the steps discussed with regard to FIG. 8 will reference the example system of FIG. 5, this is only an example; these or similar steps may also be performed on variations of that system.

At step 802, an intermediate buffering device (e.g., device 530, intermediate buffering device 540, intermediate buffering device 550) receives first element information destined for a processing device. The first element information may correspond to a first element of a code sequence requested by the processing device and may be received from a first memory device (e.g., processing device 510).

At step 804, the intermediate buffering device receives second element information destined for the processing device. The second element information may correspond to a second element of the code sequence requested by the processing device and may be received from a second memory device (e.g., processing device 520).

At step 806, the intermediate buffering device transmits the first element information to the processing device.

At step 808, the intermediate buffering device stores the second element information in an element buffering device (e.g., element buffering device 544, element buffering device 554).

Thus, various examples have been described in which a code sequence may be decoded using a parallel decoding process that may reduce memory collisions. As a result, the throughput of a decoding device, such as decoding device 200, may be increased. In some arrangements, the pre-run process (e.g., $T_{pre}$) may be determined to be large enough to avoid an empty intermediate buffering device during a particular cycle, while being small enough to minimize the buffer sizes of the intermediate buffering devices.

Alternatively, the following approach may be used for memory collision resolution in a turbo decoding device. First, decoding device 220 may read data linearly from the memory device at its input. In order to allow decoding device 240 the same linear reading process, decoding device 220 may write its output data together with the input data (e.g., as a sum of the input data and the extrinsic information) in a permuted order into the memory devices. In addition, an intermediate stage of output buffering devices (e.g., device 410) may be used in decoding device 220 between the processing devices and the memory devices to reduce memory collisions.

With reference to decoding device 240, data may already be stored in the correct order such that a linear reading without mapping may be applied (e.g., no collisions may be seen at the input). Since the processing device of decoding device 240 operates on the permuted code sequence, the inverse permutation is applied to write the data back to the memory devices, which allows decoding device 220 to again linearly read the data. In addition, an intermediate stage of output buffering devices (e.g., device 410) may be used in decoding device 240 between the processing devices and the memory devices to reduce memory collisions. In this way, both decoding devices 220 and 240 may linearly read data without memory collisions and resolve the memory collisions at the output. Similar to the example described with reference to FIGS. 6*a*-6*f*, two memory collision resolution stages may be used at the output of decoding devices 220 and 240.

While various embodiments have been illustrated and described, they are merely examples. The words used in this specification are words of description rather than limitation, and it is understood that various changes may be made without departing from the spirit and scope of the present disclosure.

The invention claimed is:

1. A device, comprising:
an intermediate buffering device including an address buffering device and an element buffering device,
wherein the intermediate buffering device is communicatively coupled to a plurality of processing devices and a memory device, and
wherein, during a cycle of a process having a parallel memory access, the intermediate buffering device is configured to:
receive, from one of the plurality of processing devices, first address information destined for the memory device, wherein the first address information corresponds to a first element of a code sequence stored in the memory device;
receive, from another of the plurality of processing devices, second address information destined for the memory device, wherein the second address information corresponds to a second element of the code sequence stored in the memory device;

transmit, to the memory device, a request for the first element based on the first address information;

store the second address information in the address buffering device;

receive, from the memory device, first element information corresponding to the first element; and store the first element information in the element buffering device.

2. The device of claim 1, wherein the process is a parallel decoding process.

3. The device of claim 1, wherein each of the address buffering device and the element buffering device is configured to be accessed multiple times during a single cycle of the process.

4. The device of claim 1, wherein the address buffering device is a first First In, First Out (FIFO) memory device, and wherein the element buffering device is a second FIFO memory device.

5. The device of claim 1, further comprising a logic device communicatively coupled to the intermediate buffering device and the plurality of processing devices, wherein the logic device is configured to receive address information from the plurality of processing devices and transmit the received address information to the address buffering device in a predetermined order.

6. The device of claim 1, wherein the cycle is a cycle in a pre-run process of a parallel decoding process, and wherein, during a subsequent cycle in the pre-run process, the intermediate buffering device is further configured to:

transmit, to the memory device, a request for the second element based on the second address information;

receive, from the memory device, second element information corresponding to the second element; and store the second element information in the element buffering device.

7. The device of claim 6, wherein the intermediate buffering device is further configured to:

determine a number of cycles to be included in the pre-run process.

8. The device of claim 6, wherein, during a cycle after the pre-run process, the intermediate buffering device is further configured to:

transmit, to the first processing device, the first element information; and transmit, to the second processing device, the second element information.

9. A device, comprising:

an intermediate buffering device including an address buffering device and an element buffering device, wherein the intermediate buffering device is communicatively coupled to a plurality of processing devices and a memory device, and wherein, during a cycle of a process having a parallel memory access, the intermediate buffering device is configured to:

receive, from a first processing device, first element information and first address information destined for a memory device, wherein the first element information and the first address information correspond to a first element of a first sub-block of a code sequence;

receive, from a second processing device different from the first processing device, second element information and second address information destined for the memory device, wherein the second element information and the second address information correspond to a second element of a second sub-block of the code sequence;

transmit the first element information and the first address information to the memory device;

store the second element information in the element buffering device; and store the second address information in the address buffering device.

10. The device of claim 9, wherein the memory device is a first memory device, wherein the element buffering device is a first element buffering device, wherein the address buffering device is a first address buffering device, and wherein the intermediate buffering device is configured to:

receive, from the first processing device, third element information and third address information destined for a second memory device different from the first memory device, wherein the third element information and the third address information correspond to a third element of the first sub-block of the code sequence;

receive, from the second processing device, fourth element information and fourth address information destined for the second memory device, wherein the fourth element information and the fourth address information correspond to a fourth element of the second sub-block of the code sequence;

transmit the third element information and the third address information to the second memory device;

store the fourth element information in a second element buffering device different from the first element buffering device; and store the fourth address information in a second address buffering device different from the first address buffering device.

11. The device of claim 9, wherein each of the address buffering device and the element buffering device is configured to be accessed multiple times during a single cycle of the process.

12. The device of claim 11, wherein the process is a parallel decoding process.

13. A method, comprising:

receiving, by an intermediate buffering device from a first processing device, first address information destined for a memory device, wherein the first address information corresponds to a first element of a code sequence stored in the memory device;

receiving, by the intermediate buffering device from a second processing device different from the first processing device, second address information destined for the memory device, wherein the second address information corresponds to a second element of the code sequence stored in the memory device;

transmitting, by the intermediate buffering device to the memory device, a request for the first element based on the first address information; and storing, by the intermediate buffering device, the second address information in an address buffering device of the intermediate buffering device.

14. The method of claim 13, further comprising:

receiving, by the intermediate buffering device from the memory device, first element information corresponding to the first element; and storing, by the intermediate buffering device, the first element information in an element buffering device of the intermediate buffering device.

15. The method of claim 14, further comprising:
transmitting, by the intermediate buffering device to the memory device, a request for the second element based on the second address information;
receiving, by the intermediate buffering device from the memory device, second element information corresponding to the second element; and
storing, by the intermediate buffering device, the second element information in the element buffering device of the intermediate buffering device.

16. The method of claim 15, further comprising:
transmitting, by the intermediate buffering device to the first processing device, the first element information; and
transmitting, by the intermediate buffering device to the second processing device, the second element information.

17. The method of claim 13, wherein the intermediate buffering device is a first intermediate buffering device, wherein the code sequence is a first sub-block of a code sequence that includes the first sub-block and a second sub-block, wherein the address buffering device is a first address buffering device, and wherein the memory device is a first memory device, the method further comprising:
receiving, by a second intermediate buffering device from the first processing device, third address information destined for a second memory device, wherein the third address information corresponds to a third element of the second sub-block stored in the second memory device;
receiving, by the second intermediate buffering device from the second processing device, fourth address information destined for the second memory device, wherein the fourth address information corresponds to a fourth element of the second sub-block stored in the second memory device;
transmitting, by the second intermediate buffering device to the second memory device, a request for the third element based on the third address information; and
storing, by the second intermediate buffering device, the fourth address information in a second address buffering device of the second intermediate buffering device.

18. The method of claim 17, wherein the element buffering device is a first element buffering device, the method further comprising:
receiving, by the second intermediate buffering device from the second memory device, third element information corresponding to the third element; and
storing, by the second intermediate buffering device, the third element information in a second element buffering device of the second intermediate buffering device.

19. The method of claim 18, further comprising:
transmitting, by the second intermediate buffering device to the second memory device, a request for the fourth element based on the fourth address information;
receiving, by the second intermediate buffering device from the second memory device, fourth element information corresponding to the fourth element; and
storing, by the second intermediate buffering device, the fourth element information in the second element buffering device of the second intermediate buffering device.

20. The method of claim 19, further comprising:
transmitting, by the second intermediate buffering device to the first processing device, the third element information; and
transmitting, by the second intermediate buffering device to the second processing device, the fourth element information.

* * * * *